(12) United States Patent
Miyake

(10) Patent No.: US 9,614,019 B2
(45) Date of Patent: Apr. 4, 2017

(54) INPUT DEVICE

(71) Applicant: Semiconductor Energy Laboratory Co., Ltd., Kanagawa-ken (JP)

(72) Inventor: Hiroyuki Miyake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1 day.

(21) Appl. No.: 14/722,375

(22) Filed: May 27, 2015

(65) Prior Publication Data
US 2015/0349041 A1 Dec. 3, 2015

(30) Foreign Application Priority Data

May 30, 2014 (JP) ................................ 2014-112116

(51) Int. Cl.
*H01L 27/32* (2006.01)
*H01L 29/786* (2006.01)
*G06F 3/041* (2006.01)
*G06F 3/044* (2006.01)

(52) U.S. Cl.
CPC .......... *H01L 27/3262* (2013.01); *G06F 3/044* (2013.01); *G06F 3/0412* (2013.01); *H01L 27/323* (2013.01); *H01L 27/3265* (2013.01); *H01L 29/7869* (2013.01); *G06F 2203/04102* (2013.01)

(58) Field of Classification Search
CPC combination set(s) only.
See application file for complete search history.

(56) References Cited

U.S. PATENT DOCUMENTS

| 8,610,155 | B2 | 12/2013 | Hatano et al. | |
|---|---|---|---|---|
| 8,823,893 | B2 | 9/2014 | Yamazaki | |
| 2004/0061118 | A1* | 4/2004 | Yamazaki | H01L 51/5259 257/79 |
| 2004/0125250 | A1* | 7/2004 | Park | G02F 1/1368 349/43 |
| 2008/0309589 | A1 | 12/2008 | Morales | |
| 2009/0001378 | A1* | 1/2009 | Miyake | G09G 3/325 257/71 |
| 2010/0007632 | A1* | 1/2010 | Yamazaki | H01L 27/3234 345/175 |
| 2010/0097354 | A1 | 4/2010 | Ahn et al. | |
| 2010/0149104 | A1 | 6/2010 | Sim et al. | |

(Continued)

FOREIGN PATENT DOCUMENTS

| JP | 2010-153813 | 7/2010 |
|---|---|---|
| JP | 2012-190794 | 10/2012 |

*Primary Examiner* — Kyoung Lee
*Assistant Examiner* — Ratisha Mehta
(74) *Attorney, Agent, or Firm* — Husch Blackwell LLP

(57) ABSTRACT

To provide a novel input device that can be manufactured at low cost or has high reliability. The input device includes a first flexible base material, a second flexible base material, and a sensor circuit that can sense an object such as a finger that is close to or in contact with a surface of the second flexible base material. The sensor circuit includes a transistor portion including a first transistor and a light-emitting element including a second transistor. The first transistor and the second transistor are provided on the first flexible base material side. Connection defects can be less likely to occur, which leads to an increase in the reliability of the input device.

21 Claims, 6 Drawing Sheets

(56) References Cited

U.S. PATENT DOCUMENTS

| | | | |
|---|---|---|---|
| 2010/0252832 A1* | 10/2010 | Asano | H01L 27/1214 257/57 |
| 2012/0217516 A1 | 8/2012 | Hatano et al. | |
| 2013/0257798 A1 | 10/2013 | Tamura et al. | |
| 2013/0307800 A1* | 11/2013 | Cheng | G06F 3/0412 345/173 |
| 2013/0321333 A1 | 12/2013 | Tamura | |
| 2014/0043546 A1 | 2/2014 | Yamazaki et al. | |
| 2014/0204285 A1 | 7/2014 | Jang | |
| 2014/0240617 A1 | 8/2014 | Fukutome et al. | |
| 2014/0285732 A1 | 9/2014 | Tanabe et al. | |
| 2014/0354905 A1 | 12/2014 | Kitchens et al. | |
| 2015/0009171 A1 | 1/2015 | Shepelev | |
| 2015/0144920 A1 | 5/2015 | Yamazaki et al. | |
| 2015/0242012 A1 | 8/2015 | Petcavich et al. | |
| 2015/0255518 A1 | 9/2015 | Watanabe et al. | |
| 2015/0261332 A1 | 9/2015 | Nakamura et al. | |
| 2015/0261333 A1 | 9/2015 | Kaneyasu et al. | |
| 2015/0261352 A1 | 9/2015 | Miyake | |
| 2015/0301382 A1 | 10/2015 | Ishitani et al. | |
| 2015/0301422 A1 | 10/2015 | Miyake et al. | |
| 2015/0317014 A1 | 11/2015 | Miyake et al. | |
| 2015/0317015 A1 | 11/2015 | Eguchi et al. | |
| 2015/0317020 A1 | 11/2015 | Watanabe et al. | |
| 2015/0317265 A1 | 11/2015 | Iwaki et al. | |
| 2015/0318339 A1 | 11/2015 | Nakamura et al. | |
| 2015/0355763 A1 | 12/2015 | Miyake et al. | |

\* cited by examiner

FIG. 6A1
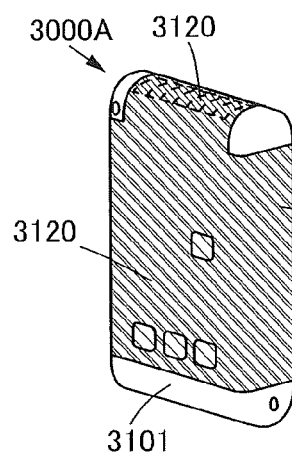
FIG. 6A2
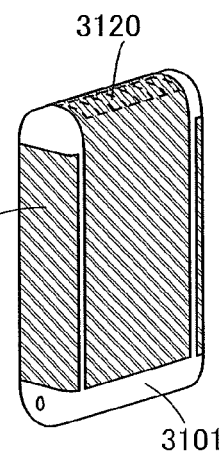
FIG. 6A3
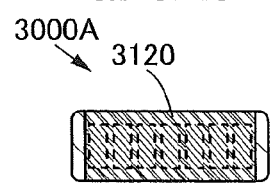
FIG. 6B1
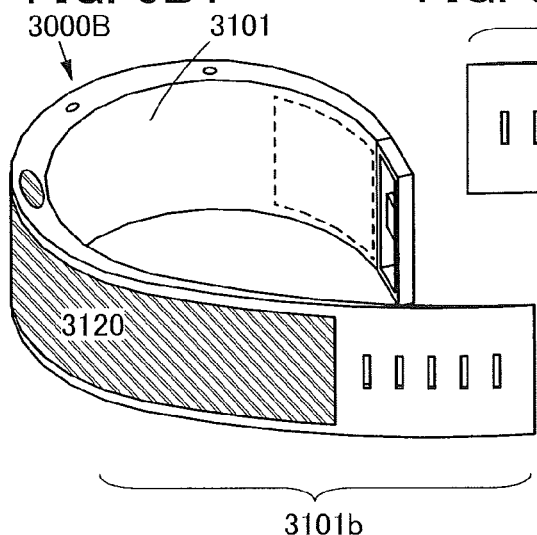
FIG. 6B2
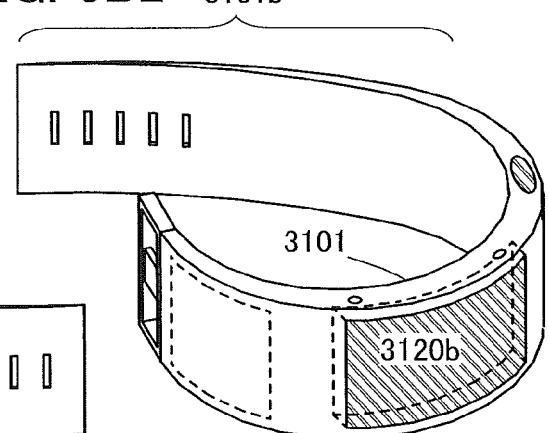
FIG. 6C1
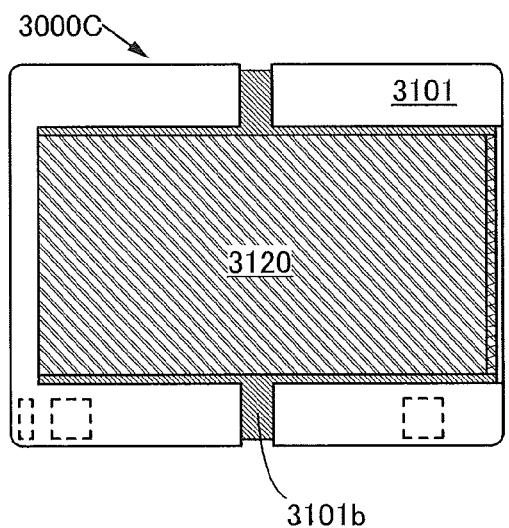
FIG. 6C2
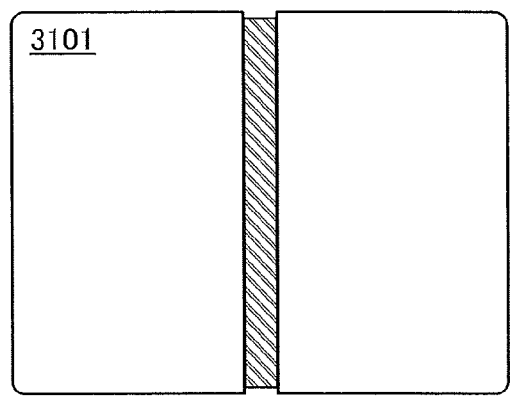

INPUT DEVICE

BACKGROUND OF THE INVENTION

1. Field of the Invention

One embodiment of the present invention relates to an input device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

The social infrastructures relating to means for transmitting information have advanced. This has made it possible to acquire, process, and send out many pieces and various kinds of information with the use of an information processing device not only at home or office but also at other visiting places.

With this being the situation, portable information processing devices are under active development.

For example, portable information processing devices are often used while being carried around by a user, and force might be accidentally applied, by dropping, to the information processing devices and display devices included in them. As an example of a display device that is not easily broken, a display device having high adhesiveness between a structure body by which a light-emitting layer is divided and a second electrode layer is known (Patent Document 1).

For example, a cellular phone is known in which a display device is provided on a front side and on an upper side in the longitudinal direction of a housing (Patent Document 2).

REFERENCE

Patent Document

[Patent Document 1] Japanese Published Patent Application No. 2012-190794
[Patent Document 2] Japanese Published Patent Application No. 2010-153813

SUMMARY OF THE INVENTION

An object of one embodiment of the present invention is to provide a novel input device that can be manufactured at low cost or has high reliability. Another object is to provide a novel input device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an input device that includes a first flexible base material, a second flexible base material, and a sensor circuit including a transistor portion including a first transistor and a light-emitting element including a second transistor. The first transistor and the second transistor are provided on the first flexible base material side.

Another embodiment of the present invention is the input device in which the sensor circuit is configured to sense an object close to or in contact with a surface of the second flexible base material.

Another embodiment of the present invention is the input device in which part of a step of manufacturing the first transistor is the same as part of a step of manufacturing the second transistor.

Another embodiment of the present invention is the input device in which the first transistor and the second transistor are connected to respective external circuits over the first flexible base material.

Another embodiment of the present invention is the input device in which the first transistor and the second transistor are connected to one external circuit.

Another embodiment of the present invention is the input device in which the second transistor includes a first electrode formed using a mask including slits.

Another embodiment of the present invention is the input device in which the first transistor includes an oxide semiconductor layer as a semiconductor layer.

Another embodiment of the present invention is the input device in which the second transistor includes an oxide semiconductor layer as a semiconductor layer.

Another embodiment of the present invention is the input device in which the first transistor and the second transistor each include an oxide semiconductor layer as a semiconductor layer.

Another embodiment of the present invention is an input device that includes at least a sensor circuit, a flexible base material supporting the sensor circuit, and a light-emitting element.

The sensor circuit can supply a sensor signal based on a change in capacitance. The sensor circuit includes at least first to fifth wirings, first to third transistors, and first and second capacitors.

Another embodiment of the present invention is the input device including a sensor circuit provided over one flexible base material. The sensor circuit and the light-emitting element each include a transistor and part of a step of manufacturing the transistor included in the sensor circuit is the same as part of a step of manufacturing the transistor included in the light-emitting element; thus, the input device can be manufactured at lower cost than that in the case where the sensor circuit and the light-emitting element are separately formed over different base materials.

According to one embodiment of the present invention, each transistor is necessarily connected to an external circuit. According to one embodiment of the present invention, the transistors are provided over one flexible base material; thus, the transistors may be connected to the external circuit over the one flexible base material. Accordingly, connection defects are less likely to occur, which leads to an increase in the reliability of the input device. Furthermore, the sensor circuit and the light-emitting element can be driven by one external circuit; the size of the input device can be reduced accordingly.

Note that in this specification and the like, the flexible base material means a base material that is "capable of being bent".

Furthermore, in this specification and the like, the light-emitting element includes at least a substance capable of emitting light, a first electrode and a second electrode between which the substance capable of emitting light is provided, and the first transistor.

Furthermore, in this specification and the like, one of a first electrode and a second electrode of a transistor refers to a source electrode and the other refers to a drain electrode.

Note that in this specification, the input device might include any of the following modules in its category: a module in which a connector such as a flexible printed circuit (FPC) or a tape carrier package (TCP) is attached to an input device; a module having a TCP provided with a printed wiring board at the end thereof; and a module having an integrated circuit (IC) directly mounted over a substrate over which a sensor circuit is formed by a chip on glass (COG) method.

Note that in this specification and the like, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification and the like, although the connection relationship of the transistor is described assuming that the source and the drain are fixed in some cases for convenience, actually, the names of the source and the drain interchange with each other depending on the relationship of the potentials.

In this specification and the like, the term "source" of a transistor means a source region that is part of a semiconductor film functioning as an active layer or a source electrode connected to the semiconductor film. Similarly, the term "drain" of the transistor means a drain region that is part of the semiconductor film or a drain electrode connected to the semiconductor film. The term "gate" means a gate electrode.

In this specification and the like, the term "connection" means electrical connection and corresponds to the case of a circuit configuration in which current, voltage, or a potential can be supplied or transmitted. Therefore, a circuit configuration in which connection is made does not necessarily refers to a state of direct connection, and also includes a circuit configuration in which connection is indirectly made through a circuit element such as a wiring, a resistor, a diode, or a transistor so that current, voltage, and a potential can be supplied or transmitted.

In this specification and the like, even when different components are connected to each other in a circuit diagram, there is actually a case where one conductive film has functions of a plurality of components such as a case where part of a wiring serves as an electrode. The term "connection" in this specification and the like also means such a case where one conductive film has functions of a plurality of components.

According to one embodiment of the present invention, a novel input device that can be manufactured, at low cost or has high reliability can be provided. Alternatively, a novel input device can be provided. Note that the description of these effects does not disturb the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

In the accompanying drawings:

FIG. 1A is a circuit diagram illustrating a structure of a sensor circuit of one embodiment and FIGS. 1B1 and 1B2 are timing charts illustrating a driving method thereof;

FIG. 2 is a cross-sectional view illustrating a structure of an input device of one embodiment;

FIGS. 6A1, 6A2, 6A3, 6B1, 6B2, 6C1, and 6C2 are each a projection view illustrating a structure of an information processing device of one embodiment.

DETAILED DESCRIPTION OF THE INVENTION

Figure 1A:
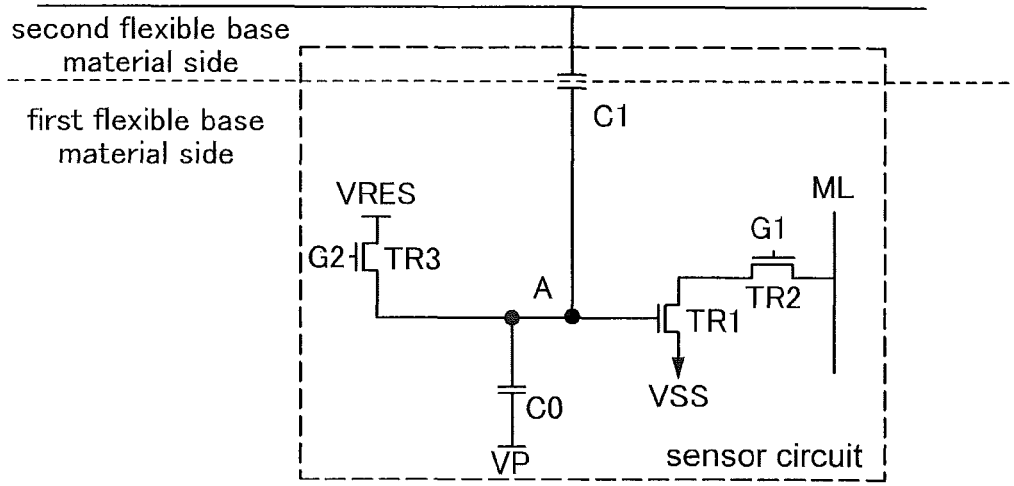
Figure 1A:
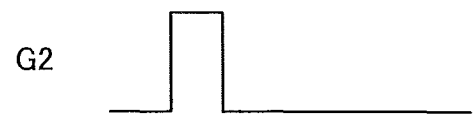
Figure 1A:
Figure 1A:
Figure 1A:
Figure 1A:
Figure 1A:
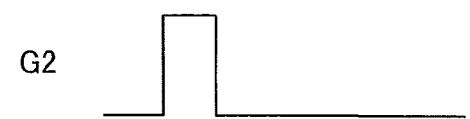
Figure 1A:
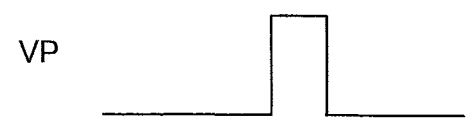
Figure 1A:
Figure 1A:
Figure 1A:

One embodiment of the present invention is an input device including at least a sensor circuit, a flexible base material supporting the sensor circuit, and a light-emitting element.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

(Embodiment 1)

Figure 2:
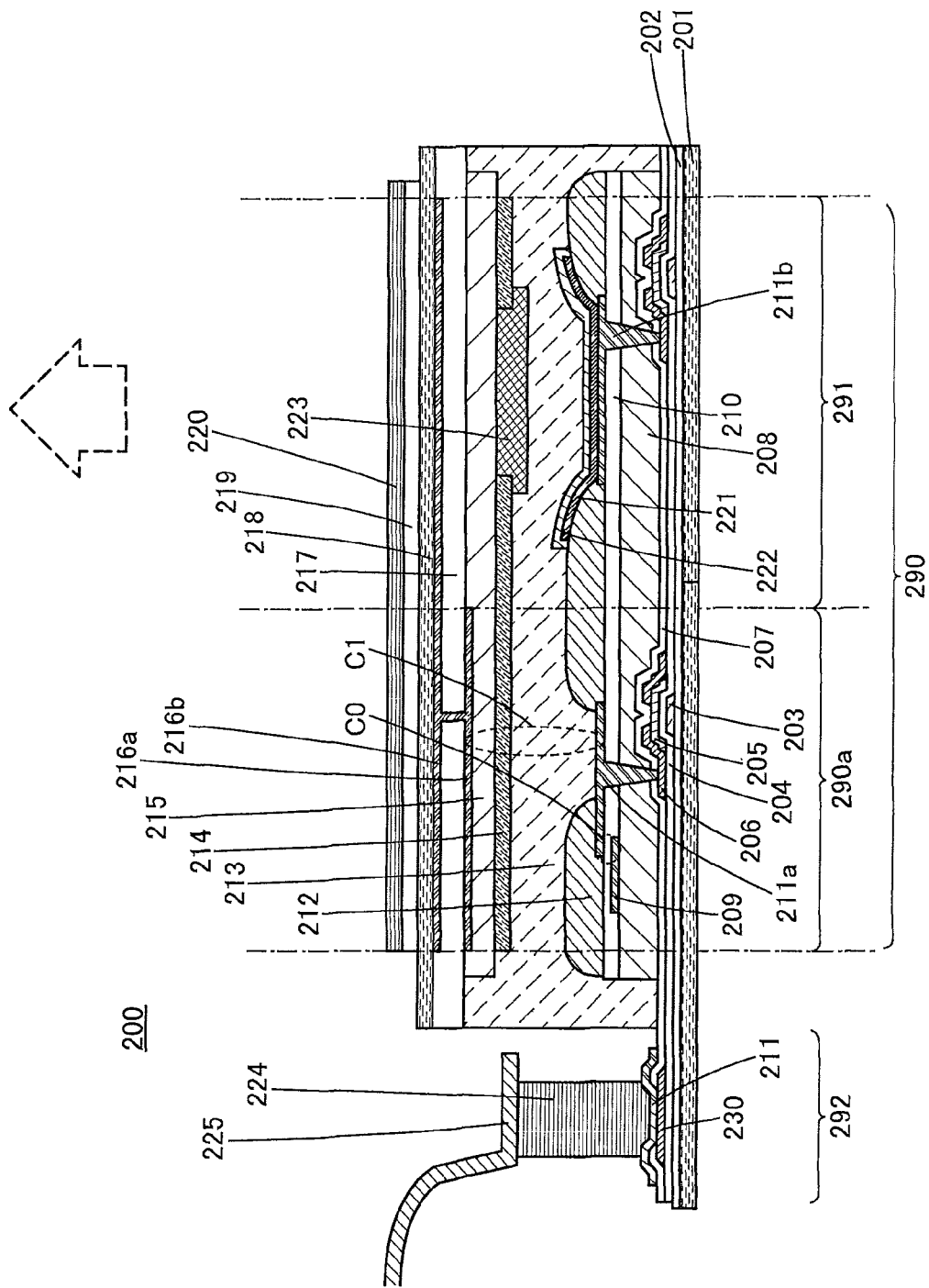

In this embodiment, a structure and a driving method of a sensor circuit which can be used in an input device 200 of one embodiment of the present invention are described using a circuit diagram of FIG. 1A and timing charts shown in FIGS. 1B1 and 1B2.

(Structures and Operations of Sensor Element and Sensor Circuit)

Components of the sensor circuit are provided on a first flexible base material and a second flexible base material. The sensor circuit includes at least a scan line G1, a scan line G2, a wiring VRES, a wiring VP, a wiring VSS, a first transistor TR1, a second transistor TR2, a third transistor TR3, a capacitor C0, a capacitor C1, and a monitor line ML.

Of the above components, a first electrode included in the capacitor C1 is provided on the second flexible base material side, and the other components are provided on the first flexible base material side.

(Flexible Base Material)

As the flexible base material, an organic material, an inorganic material, or a composite material of an organic material and an inorganic material can be used.

A material with which passage of impurities is inhibited can be favorably used as the flexible base material. For example, a material with a vapor permeability of lower than or equal to $10^{-5}$ g/(m²·day), preferably lower than or equal to $10^{-6}$ g/(m²·day) can be favorably used.

Examples of the flexible base material are organic materials such as a resin, a resin film, and a plastic film.

Examples of the flexible base material are inorganic materials such as a metal plate and a thin glass plate with a thickness of greater than or equal to 10 μm and less than or equal to 50 μm.

Examples of the flexible base material are composite materials such as a resin film to which a metal plate, a thin glass plate, or a film of an inorganic material is attached using a resin layer.

Examples of the flexible base material are composite materials such as a resin or a resin film into which a fibrous or particulate metal, glass, or inorganic material is dispersed.

For example, a thermosetting resin or an ultraviolet curable resin can be used for a resin layer.

Specifically, polyester, polyolefin, polyamide, polyimide, polycarbonate, an acrylic resin, or the like can be used as the resin, the resin film, or the plastic film.

Specifically, non-alkali glass, soda-lime glass, potash glass, crystal glass, or the like can be used as the glass plate.

Specifically, a metal oxide film, a metal nitride film, a metal oxynitride film, or the like can be used as the inorganic material. For example, silicon oxide, silicon nitride, silicon oxynitride, an alumina film, or the like can be used as the metal oxide film, the metal nitride film, or the metal oxynitride film.

Specifically, SUS, aluminum, or the like provided with an opening can be used as the metal plate.

Specifically, a resin such as an acrylic resin, a urethane resin, an epoxy resin, or a resin having a siloxane bond can be used as the thermosetting resin or the ultraviolet curable resin.

(Wiring Material)

Any of various conductive films can be used as the wirings.

Specifically, a metal element selected from aluminum, chromium, copper, tantalum, titanium, molybdenum, tungsten, nickel, yttrium, zirconium, silver, and manganese; an alloy containing any of the above-described metal elements as a component; an alloy containing any of the above-described metal elements in combination; or the like can be used. In particular, one or more elements selected from aluminum, chromium, copper, tantalum, titanium, molybdenum, and tungsten are preferably contained. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked structure in which a film of a metal selected from metals such as titanium, tantalum, tungsten, molybdenum, chromium, neodymium, and scandium, or an alloy film or a nitride film containing one or more metals selected from these metals is stacked over an aluminum film can be used.

Alternatively, a light-transmitting conductive material containing indium oxide, tin oxide, or zinc oxide may be used.

(Transistor)

Any of various kinds of transistors can be used.

Specifically, transistors of a bottom-gate type, a top-gate type, or the like can be used.

(Capacitor C1)

A second electrode of the capacitor C1 is electrically connected to a gate of the first transistor TR1, a first electrode of the capacitor C0, and a first terminal of the third transistor TR3.

(Capacitor C0)

A second electrode of the capacitor C0 is electrically connected to the wiring VP through which a control signal capable of controlling a potential can be supplied.

(Transistor TR1)

A first terminal of the first transistor TR1 is electrically connected to the wiring VSS through which, for example, a ground potential can be supplied, and a second terminal of the first transistor TR1 is electrically connected to a first terminal of the second transistor TR2.

(Transistor TR2)

A gate of the second transistor TR2 is electrically connected to the scan line G1 through which a selection signal can be supplied, and a second terminal of the second transistor TR2 is electrically connected to the monitor line ML.

(Transistor TR3)

A gate of the third transistor TR3 is electrically connected to the scan line G2 through which a selection signal can be supplied, and a second terminal of the third transistor TR3 is electrically connected to the wiring VRES through which, for example, a ground potential can be supplied.

(Node A)

Note that a portion where the second electrode of the capacitor C1, the first electrode of the capacitor C0, the gate of the first transistor TR1, and the first terminal of the third transistor TR3 are electrically connected to one another is referred to as a node A.

The sensor circuit can sense an object such as a finger close to or in contact with a surface of the second flexible base material.

<Method for Driving Sensor Circuit>

FIGS. 1B1 and 1B2 are timing charts for describing a method for driving the sensor circuit of one embodiment of the present invention. FIG. 1B1 shows a state where the object is not sensed and FIG. 1B2 shows a state where the object is sensed.

(First Step)

In a first step, by supplying a selection signal to the scan line G2 to turn on the third transistor TR3, the node A and the wiring VRES are electrically connected to each other, so that the potential of the node A is set to a predetermined potential, e.g., a ground potential. After that, the supply of the selection signal to the scan line G2 is stopped to turn off the third transistor TR3.

(Second Step)

In a second step, by changing the potential of the wiring VP, the potential of the node A is set to a predetermined potential based on the capacitance of the capacitor C0 and the capacitor C1.

Here, in the case where the object such as a finger is close to or in contact with the surface of the second flexible base material, capacitance is generated between the sensor circuit and the object such as a finger; thus, the capacitance of the capacitor C1 is increased. Therefore, the amount of change in the potential of the node A is smaller than that in the case where the object such as a finger is not close to or in contact with the surface of the second flexible base material (see FIG. 1B2).

(Third Step)

In a third step, by supplying a selection signal to the scan line G1 to turn on the second transistor TR2, a signal based on the change in the potential of the node A is supplied to the monitor line ML.

For example, owing to a decrease in the amount of change in the potential of the node A, the amount of change in the potential of the signal supplied to the monitor line ML is decreased.

(Fourth Step)

In a fourth step, the supply of the selection signal to the scan line G1 is stopped to turn off the second transistor TR2.

This embodiment can be combined with any of the other embodiments in this specification as appropriate.

(Embodiment 2)

In this embodiment, a structure of an input device of one embodiment of the present invention is described with reference to FIG. 2.

FIG. 2 is a cross-sectional view illustrating a structure of the input device 200 of one embodiment of the present invention.

(Overall Structure)

The input device 200 of one embodiment of the present invention includes a first flexible base material, a second flexible base material, a portion between the first flexible base material and the second flexible base material, and a connection portion that is connected to an external circuit formed over the first flexible base material.

Connection between the input device and the external circuit is made using a connection terminal provided in a portion that is not used for display, specifically, a peripheral portion of the input device. Connection between the input device and the external circuit is made by electrically connecting a flexible printed circuit (FPC) and the connection terminal to each other. Note that the connection method is not limited to the above method as long as connection to the external circuit is made.

(Sensor Circuit 290)

A sensor circuit 290 includes a transistor portion 290a where the transistors are formed and a region where a transistor is not formed and an electrode for sensing is formed.

The sensor circuit 290 includes a first flexible base material 201 and an insulating layer 202 formed over the first flexible base material 201.

The sensor circuit 290 further includes a gate electrode 203 formed over the insulating layer 202, a gate insulating layer 204 formed over the gate electrode 203, a semiconductor layer 205 formed over the gate insulating layer 204, and a pair of electrodes 206 formed over the semiconductor layer 205.

The sensor circuit 290 further includes an insulating layer 207 formed over the pair of electrodes 206, an insulating layer 208 formed over the insulating layer 207, an electrode 209 formed over the insulating layer 208, and an insulating layer 210 formed over the electrode 209.

The sensor circuit 290 further includes an electrode 211a that is formed over the insulating layer 210 and electrically connected to one of the pair of electrodes 206 and an insulator 212 formed over the electrode 211a to cover an end of the electrode 211a.

The sensor circuit 290 further includes a second flexible base material 218, an electrode 216b formed on the second flexible base material 218, an insulating layer 217 and an electrode 216a formed on the electrode 216b, an insulating layer 215 formed on the electrode 216a, and a light-blocking layer 214 formed on the insulating layer 215.

The sensor circuit 290 is formed by bonding the first flexible base material 201 and the second flexible base material 218 with a sealant 213.

The sensor circuit 290 includes, on a surface of the second flexible base material 218 on which the sensor circuit is not formed, an insulating layer 219 and an anti-reflective film 220 formed over the insulating layer 219. The insulating layer 219 and the anti-reflective film 220 may be formed after the first flexible base material 201 and the second flexible base material 218 are bonded to each other with the sealant 213.

In the sensor circuit 290, the transistor portion 290a is formed to be covered with the light-blocking layer 214.

The electrode 209, the electrode 211a, and the insulating layer 210 form the capacitor C0, and the electrode 211a, the electrode 216a, and the insulators provided therebetween form the capacitor C1.

In addition to a method in which the sensor circuit is directly formed over the first flexible base material 201, the following method may be employed: the sensor circuit is formed over a base material different from the first flexible base material 201, the base material and the sensor circuit are separated from each other, and then, the sensor circuit and the first flexible base material 201 are bonded to each other. In that case, a bonding layer may be provided between the first flexible base material 201 and the sensor circuit.

In addition to a method in which the sensor circuit is directly formed over the second flexible base material 218, the following method may be employed: the sensor circuit is formed over a base material different from the second flexible base material 218, the base material and the sensor circuit are separated from each other, and then, the sensor circuit and the second flexible base material 218 are bonded to each other. In that case, a bonding layer may be provided between the second flexible base material 218 and the sensor circuit.

(Insulating Layer 202)

In the case where the first flexible base material 201 is a material through which moisture or oxygen passes, the insulating layer 202 needs to have a function of preventing entry of moisture or oxygen from the outside.

For example, as the insulating layer 202, an inorganic material layer of silicon oxide, silicon nitride, or silicon oxynitride, a stack of any of these materials, a composite layer of any of these materials, or the like can be selected in accordance with conditions required for the input device of this embodiment. In particular, in the case where the light-emitting element 291 contains an organic light-emitting compound, it is necessary to pay careful attention to entry of moisture or oxygen because, for example, the properties of the organic light-emitting compound deteriorate owing to moisture or oxygen.

(Gate Electrode 203)

As the gate electrode 203, a single metal layer, a composite layer, or the like can be selected in accordance with the conditions required for the input device of this embodiment.

For example, in the case where the input device of this embodiment has a large size, a metal with low resistance (e.g., copper or aluminum) can be used for the gate electrode 203.

Alternatively, a composite layer or an alloy of a metal with low resistance and another metal may be used.

(Semiconductor Layer 205)

As the semiconductor layer 205, for example, a semiconductor layer containing an oxide semiconductor, amorphous silicon, polycrystalline silicon crystallized by processing such as laser annealing, or the like can be selected in accordance with the conditions required for the input device of this embodiment.

For example, a Group 14 element, a compound semiconductor, or an oxide semiconductor can be used for the semiconductor layer. Specifically, a semiconductor containing silicon, a semiconductor containing gallium arsenide, an oxide semiconductor containing indium, or the like can be used.

For example, a film represented by an In-M-Zn oxide which contains at least indium (In), zinc (Zn), and M (a metal such as Al, Ga, Ge, Y, Zr, Sn, La, Ce, or Hf) is preferably included. Alternatively, both In and Zn are preferably contained.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor included in the oxide semiconductor film, any of the following can be used: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

(Pair of Electrodes 206)

As the pair of electrodes 206, a single metal layer, a composite layer, or the like can be selected in accordance with the conditions required for the input device of this embodiment.

For example, in the case where the input device of this embodiment has a large size, a metal with low resistance (e.g., copper or aluminum) can be used.

Alternatively, a composite layer or an alloy of a metal with low resistance and another metal may be used.

(Electrode 209)

As the electrode 209, a single metal layer, a composite layer, or the like can be selected in accordance with the conditions required for the input device of this embodiment.

For example, in the case where the input device of the this embodiment has a large size, a metal with low resistance (e.g., copper or aluminum) can be used.

Alternatively, a composite layer or an alloy of a metal with low resistance and another metal may be used.

(Sealant 213)

The sealant 213 has a higher refractive index than the air. In the case where light is extracted to the sealant 213 side, the sealant 213 also serves as an optical element.

(Insulating Layer 217)

In the case where the second flexible base material 218 is a material through which moisture or oxygen passes, the insulating layer 217 needs to have a function of preventing entry of moisture or oxygen from the outside.

For example, as the insulating layer 217, an inorganic material layer of silicon oxide, silicon nitride, or silicon oxynitride, a stack of any of these materials, a composite layer of any of these materials, or the like can be selected in accordance with the conditions required for the input device of this embodiment. In particular, in the case where the light-emitting element 291 contains an organic light-emitting compound, it is necessary to pay careful attention to entry of moisture or oxygen because, for example, the properties of the organic light-emitting compound deteriorate owing to moisture or oxygen.

(Light-Emitting Element 291)

In this embodiment, the light-emitting element 291 having a top emission structure in which light is emitted to a side opposite to a base material over which a wiring for supplying electric power to a light-emitting element when seen from an organic material layer capable of emitting light is provided is described.

The light-emitting element 291 includes an electrode 211b which is formed over the insulating layer 210 and electrically connected to one of the pair of electrodes 206 included in the transistor, the insulator 212 which is formed over the electrode 211b and covers an end of the electrode 211b, an organic material layer 221 which is formed over the electrode 211b and the insulator 212 and capable of emitting light, and an electrode 222 which is formed over the insulator 212 and the organic material layer 221 capable of emitting light.

Although an organic electroluminescent element is used as the light-emitting element 291 in this embodiment, a display element (electronic ink) that performs display by an electrophoretic method, an electronic liquid powder (registered trademark) method, an electrowetting method, or the like can be used.

(Organic Material Layer 221)

As the organic material layer 221, a low molecular organic EL material, a high molecular organic EL material, or an inorganic EL material can be used. In the case of using a high molecular organic EL material, the organic material layer 221 can also be formed by a coating method.

As the organic material layer 221, a thin film containing a light-emitting material that emits light (fluorescence) by singlet excitation (a singlet compound), a thin film containing a light-emitting material that emits light (phosphorescence) by triplet excitation (a triplet compound), or a thin film containing a singlet compound and a triplet compound can be used.

Alternatively, as the organic material layer 221, a stack of a thin film containing a singlet compound and a thin film containing a triplet compound can be used.

(Light-Blocking Layer 214)

As the light-blocking layer 214, carbon black, a metal oxide, a composite oxide containing a solid solution of a plurality of metal oxides, or the like can be used.

(Coloring Layer 223)

When white light is emitted from the organic material layer 221 and converted to red (R), green (G), and blue (B) by the coloring layers 223, full-color display can be achieved.

A metal material, pigment, dye, or the like can be used for the coloring layer.

Alternatively, when, for example, blue light is emitted from the organic material layer 221 and the light is partly emitted directly to the outside and partly converted to red (R) and green (G) by the coloring layers 223, full-color display can be achieved.

Note that the organic material layer 221 can also emit red (R) light, green (G) light, and blue (B) light. In that case, the coloring layer 223 is not necessarily used; however, color of light emitted from the organic material layer 221 can be adjusted by the coloring layer.

(Connection Portion 292 for Connection to External Circuit)

A connection portion 292 for connection to an external circuit includes the first flexible base material 201, the insulating layer 202 formed over the first flexible base material 201, and the gate insulating layer 204 formed over the insulating layer 202.

The connection portion 292 further includes a wiring 230 formed over the gate insulating layer 204, the insulating layer 207 including an opening overlapping with the wiring 230, and an electrode 211.

The electrode 211 is connected to the wiring 230 electrically connected to the input device of this embodiment through the opening in the insulating layer 207. The electrode 211 prevents the wiring 230 from being exposed to the outside environment.

It is preferable, in terms of reduction in cost, that the electrode 211 be formed at the same time as the electrode 211a in the transistor portion 290a and the electrode 211b in the light-emitting element 291.

For the electrode 211, a transparent conductive oxide of indium oxide, tin oxide, zinc oxide, a compound thereof, or the like can be used, for example.

Furthermore, an anisotropic conductive film 224 can electrically connect the electrode 211 and an FPC 225.

(Embodiment 3)

In this embodiment, arrangement of the sensor circuits and the light-emitting elements and connection between the light-emitting elements and an external driver circuit are described with reference to FIG. 3 and FIGS. 4A to 4C.

Figure 3:
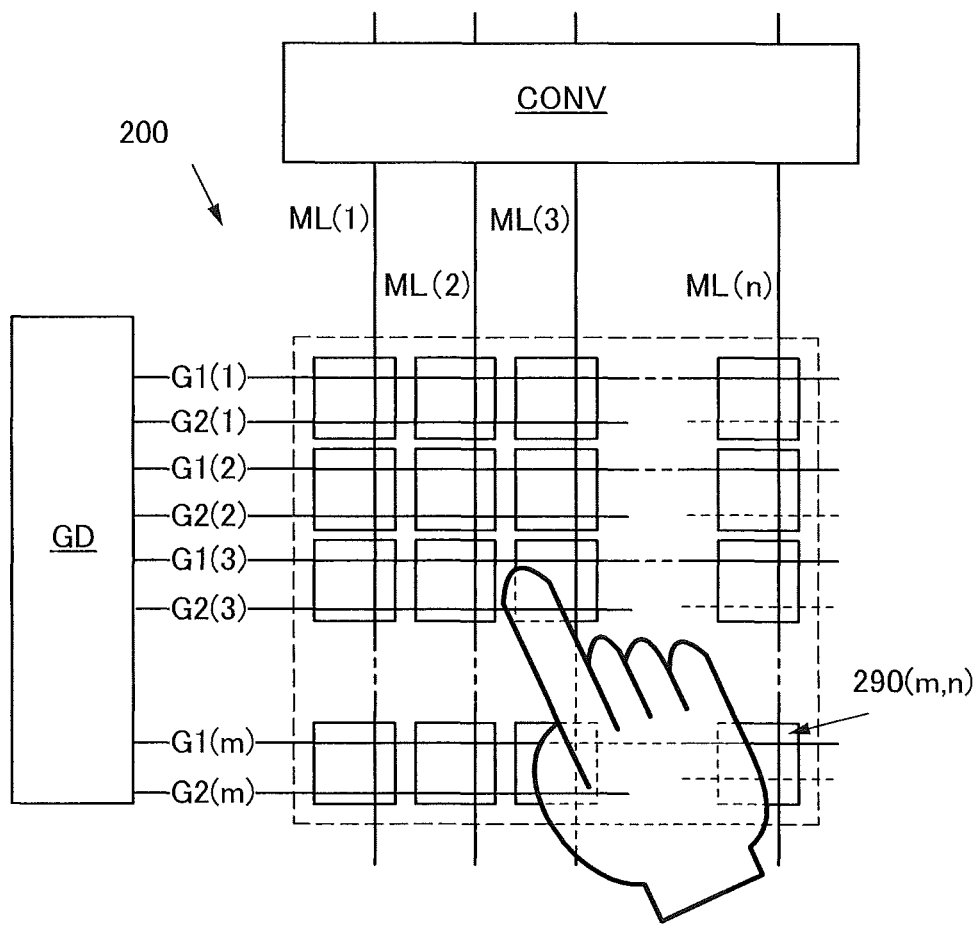
FIG. 3 is a top view illustrating arrangement of sensor circuits of one embodiment.

As illustrated in FIG. 3, a plurality of (m×n) sensor circuits 290 are arranged in a matrix in the input device 200. For example, the sensor circuit 290(m, n) is electrically connected to the scan line G1(m), the scan line G2(m), and the monitor line ML(n).

A method for driving each of the sensor circuits is described in Embodiment 1.

Specifically, when an object such as a finger is close to or in contact with the surface of the second flexible base material, the sensor circuit 290 supplies a signal based on a change in the potential of the node A to the monitor line ML.

The scan line G1(1) to the scan line G1(m) and the scan line G2(1) to the scan line G2(m) are electrically connected to a driver circuit GD.

The driver circuit GD (e.g., a shift register) is used for the sensor circuits arranged in a matrix, selection signals are sequentially supplied to the scan line G1(1) to the scan line G1(m) and the scan line G2(1) to the scan line G2(m), and signals supplied to the monitor line ML are read; thus, where in the input device 200 the object such as a finger is close to or in contact with can be sensed.

The monitor line ML(1) to the monitor line ML(n) are electrically connected to a converter CONY.

For example, the converter CONY may convert signals supplied through the monitor line ML(1) to the monitor line ML(n).

Figure 4A:
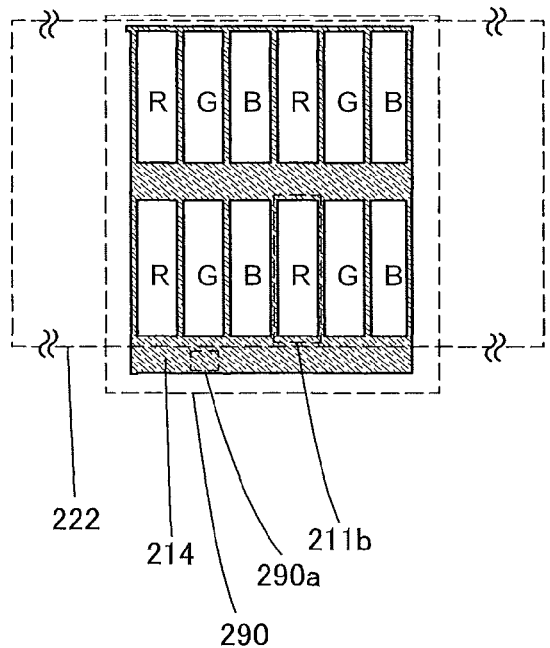
FIGS. 4A to 4C are top views each illustrating arrangement of electrodes of one embodiment.
Figure 4B:
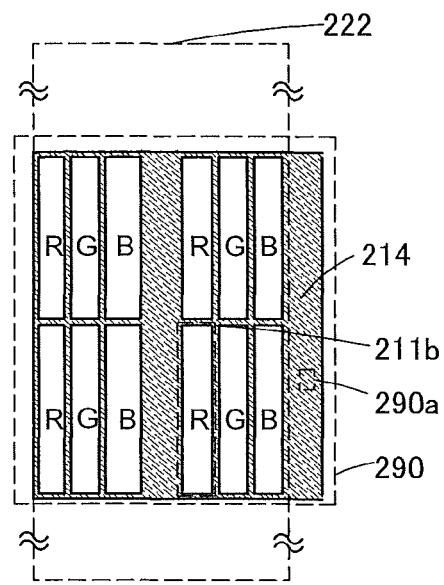
Figure 4C:
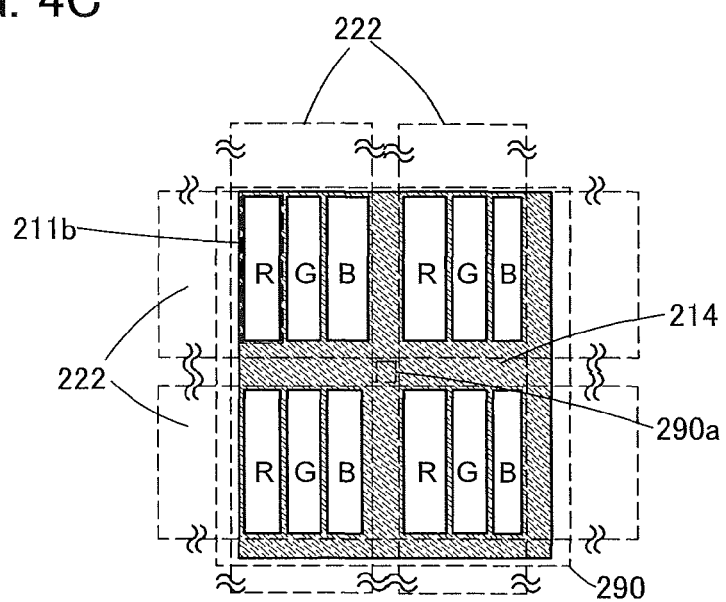

FIGS. 4A to 4C each illustrate a plane layout example of the sensor circuit 290, the transistor portion 290a, one of the electrodes 211b of the light-emitting element 291, and the light-blocking layer 214.

The light-emitting elements (also refer to pixels) (R, G, and B) are each surrounded by the light-blocking layer 214. Furthermore, the transistor portion 290a of the sensor circuit is covered with the light-blocking layer 214. The end of the electrode 211b is covered with the light-blocking layer 214.

An arrangement example in the sensor circuit 290 is illustrated in FIGS. 4A to 4C. Although an example where twelve light-emitting elements are arranged in one sensor circuit is shown, the number of pixels is not limited thereto and may be determined as necessary. The area of the sensor circuit 290 may be equal to that of the electrode 216b.

FIG. 2 illustrates one light-emitting element, and FIGS. 4A to 4C each show an example where one transistor portion 290a and twelve light-emitting elements 291 are arranged in each sensor circuit 290.

(Embodiment 4)

A method for forming the electrode 222 of the light-emitting element 291 is described. For example, the electrode 222 is selectively formed with a mask and needs to be prevented from being connected to the transistor portion 290a.

In this embodiment, the plane layout of the electrode 222 is described with reference to FIG. 2, FIG. 3, FIGS. 4A to 4C, and FIGS. 5A and 5B.

In this embodiment, the electrode 222 is selectively formed in a specific portion of the input device 200.

Figures 5A, 5B:
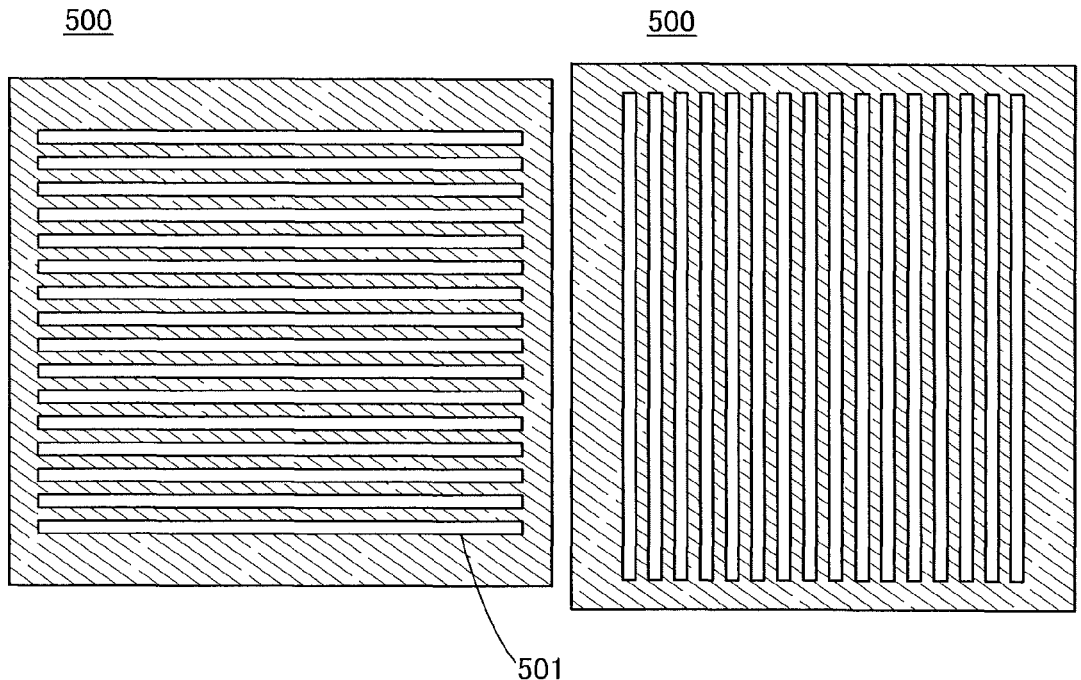
FIGS. 5A and 5B are top views of masks for manufacturing an electrode of one embodiment.

Specifically, masks 500 illustrated in FIGS. 5A and 5B are used. A plurality of slits 501 are formed in the mask 500. With the mask 500 including the slits 501, a conductive film can be selectively formed. Thus, the electrode 222 including openings in specific portions can be formed in the input device 200.

For example, the opening of the electrode 222 corresponds to a portion where the slit 501 is not formed. Alternatively, the opening of the electrode 222 corresponds to a portion where the slit 501 is formed.

In the opening of the electrode 222, any of the transistor portions 290a in FIG. 2 and FIGS. 4A to 4C is placed.

For example, in the case where the transistor portion 290a is placed in the opening of the electrode 222 as illustrated in FIG. 4A, with the mask illustrated in FIG. 5A which has slits extending in a lateral direction, the electrode 222 is formed so as not to include the transistor portion 290a.

For example, in the case where the transistor portion 290a is placed in the opening of the electrode 222 as illustrated in FIG. 4B, with the mask illustrated in FIG. 5B which has slits extending in a longitudinal direction, the electrode 222 is formed so as not to include the transistor portion 290a.

For example, in the case where the transistor portion 290a is placed in the opening of the electrode 222 as illustrated in FIG. 4C, a conductive film may be formed with the mask illustrated in FIG. 5A which has the slits extending in the lateral direction, a conductive film may be formed with the mask illustrated in FIG. 5B which has the slits extending in the longitudinal direction, and the transistor portion 290a is formed in openings of the electrode 222 which intersect with each other.

(Embodiment 5)

In this embodiment, a structure of an information processing device of one embodiment of the present invention will be described with reference to FIGS. 6A1, 6A2, 6A3, 6B1, 6B2, 6C1, and 6C2.

FIGS. 6A1 to 6C2 illustrate the information processing devices of embodiments of the present invention.

FIGS. 6A1 to 6A3 are projection views illustrating an information processing device of one embodiment of the present invention.

FIGS. 6B1 and 6B2 are projection views illustrating an information processing device of one embodiment of the present invention.

FIGS. 6C1 and 6C2 are a top view and a bottom view of an information processing device of one embodiment of the present invention.

<<Information Processing Device A>>

An information processing device 3000A includes an input/output portion 3120 and a housing 3101 supporting the input/output portion 3120 (see FIGS. 6A1 to 6A3).

The information processing device 3000A further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The information processing device 3000A can display information on its side surface and/or top surface.

A user of the information processing device 3000A can supply operation instructions by using a finger in contact with the side surface and/or the top surface.

<<Information Processing Device B>>

An information processing device 3000B includes the input/output portion 3120 and an input/output portion 3120b (see FIGS. 6B1 and 6B2).

The information processing device 3000B further includes the housing 3101 and a belt-shaped flexible housing 3101b that support the input/output portion 3120.

The information processing device 3000B further includes the housing 3101 supporting the input/output portion 3120b.

The information processing device 3000B further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The information processing device 3000B can display information on the input/output portion 3120 supported by the housing 3101 and the belt-shaped flexible housing 3101b.

A user of the information processing device 3000B can supply operation instructions by using a finger in contact with the input/output portion 3120.

<<Information Processing Device C>>

An information processing device 3000C includes the input/output portion 3120 and the housings 3101 and 3101b supporting the input/output portion 3120 (see FIGS. 6C1 and 6C2).

The input/output portion 3120 and the housing 3101b have flexibility.

The information processing device 3000C further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The information processing device 3000C can be folded in two by bending the housing 3101b.

This embodiment can be combined with any of the other embodiments in this specification as appropriate.

This application is based on Japanese Patent Application serial no. 2014-112116 filed with Japan Patent Office on May 30, 2014, the entire contents of which are hereby incorporated by reference.

What is claimed is:

1. An input device comprising:
a first flexible base material;
a second flexible base material bonded to the first flexible base material with a sealant; and
a sensor circuit including a transistor portion, a capacitor, and a light-emitting element,
wherein the transistor portion includes a first transistor,
wherein the light-emitting element includes a second transistor,
wherein the first transistor and the second transistor are provided on the first flexible base material side, and
wherein the capacitor includes a first electrode, a second electrode, and the sealant between the first electrode and the second electrode.

2. The input device according to claim 1, wherein the sensor circuit is configured to sense an object that is close to or in contact with a surface of the second flexible base material.

3. The input device according to claim 1, wherein part of a step of manufacturing the first transistor is the same as part of a step of manufacturing the second transistor.

4. The input device according to claim 1, wherein the second transistor includes a third electrode formed with a mask including slits.

5. The input device according to claim 1, wherein at least one of the first transistor and the second transistor includes an oxide semiconductor layer as a semiconductor layer.

6. The input device according to claim 1, wherein the sealant has higher refractive index than air.

7. The input device according to claim 1, wherein the transistor portion is covered with a light-blocking layer.

8. The input device according to claim 1, wherein the light-emitting element emits light toward the second flexible base material.

9. The input device according to claim 1, wherein the light-emitting element includes a fourth electrode electrically connected to the second transistor, an organic material layer over the fourth electrode, and a fifth electrode over the organic material layer.

10. The input device according to claim 1, wherein the input device further comprises a connection portion for connection to an external circuit on the first flexible base material side.

11. The input device according to claim 1, wherein the sealant overlaps with the transistor portion, the capacitor, and the light-emitting element.

12. An input device comprising:
a first flexible base material;
a first transistor electrically connected to a first electrode over the first flexible base material;
a light-emitting element including a second transistor over the first flexible base material;
a sealant over the first transistor, the first electrode, and the light-emitting element;
a second electrode over the sealant; and
a second flexible base material over the second electrode,
wherein the first flexible base material and the second flexible base material are bonded with the sealant,
wherein the first electrode and the second electrode are included in a capacitor, and wherein an object close to or in contact with a surface of the second flexible base material is sensed by using the first transistor and the capacitor.

13. The input device according to claim 12, wherein part of a step of manufacturing the first transistor is the same as part of a step of manufacturing the second transistor.

14. The input device according to claim 12, wherein the second transistor includes a third electrode formed with a mask including slits.

15. The input device according to claim 12, wherein at least one of the first transistor and the second transistor includes an oxide semiconductor layer as a semiconductor layer.

16. The input device according to claim 12, wherein the sealant has higher refractive index than air.

17. The input device according to claim 12, wherein the first transistor is covered with a light-blocking layer.

18. The input device according to claim 12, wherein the light-emitting element emits light toward the second flexible base material.

19. The input device according to claim 12, wherein the light-emitting element includes a fourth electrode electrically connected to the second transistor, an organic material layer over the fourth electrode, and a fifth electrode over the organic material layer.

20. The input device according to claim 12, wherein the input device further comprises a connection portion for connection to an external circuit on the first flexible base material side.

21. The input device according to claim 12, wherein the sealant overlaps with the first transistor, the first electrode, the light-emitting element.

* * * * *